United States Patent [19]

Ehrich et al.

[11] 4,262,085

[45] Apr. 14, 1981

[54] PROCESS FOR PREPARATION OF METAL PATTERNS ON INSULATING CARRIER MATERIALS

[75] Inventors: Hans-Jürgen Ehrich; Hartmut Mahlkow, both of Berlin, Fed. Rep. of Germany

[73] Assignee: Schering Aktiengesellschaft, Berlin and Bergkamen, Fed. Rep. of Germany

[21] Appl. No.: 88,591

[22] Filed: Oct. 26, 1979

[30] Foreign Application Priority Data

Oct. 27, 1978 [DE] Fed. Rep. of Germany ....... 2847298

[51] Int. Cl.³ .......................... C23C 3/02; H05K 3/18
[52] U.S. Cl. ...................................... 430/417; 427/98; 427/305; 427/306; 427/404
[58] Field of Search ................. 427/98, 305, 306, 404; 430/417

[56] References Cited

U.S. PATENT DOCUMENTS

| T961,007 | 8/1977 | Jukes et al. | 430/417 |
|---|---|---|---|
| 3,772,056 | 11/1973 | Polichette et al. | 430/417 |
| 3,783,005 | 1/1974 | Kenney | 430/417 |
| 3,791,340 | 2/1974 | Ferrara | 430/417 |
| 3,928,670 | 12/1975 | Brummett et al. | 427/305 |
| 3,942,983 | 3/1976 | Di Blas | 427/305 |
| 3,950,570 | 4/1976 | Kenney | 479/98 |
| 3,959,523 | 5/1976 | Grunwald et al. | 427/98 |
| 3,959,547 | 5/1976 | Polichette et al. | 427/98 |
| 3,994,727 | 11/1976 | Polichette et al. | 427/98 |
| 4,084,023 | 4/1978 | Dafter | 427/304 |
| 4,096,043 | 6/1978 | De Angelo | 427/98 |
| 4,133,908 | 1/1979 | Madsen | 427/98 |

FOREIGN PATENT DOCUMENTS

1500435  2/1978  United Kingdom ...................... 427/98

OTHER PUBLICATIONS

Giversen, "A Method of Depositing a Metal on a Surface", Western Electric Technical Digest, No. 51, Jul., 1978.

*Primary Examiner*—John D. Smith
*Attorney, Agent, or Firm*—Michael J. Striker

[57] ABSTRACT

A process for the preparation of metal patterns on insulating carriers by photochemical means, in particular for the preparation of printed circuits, is described, in which the carrier is treated with a photo-sensitizer in the absence of wetting agents; the carrier is irradiated in a manner corresponding to the desired pattern with a radiation source; the metal seeds formed on the surface are augmented with an aqueous palladium-salt solution; a nickel layer is deposited with a nickel or nickel-cobalt bath; the metal layer is treated with an aqueous solution containing a complex-forming agent for copper-(I) ions; and a copper layer is deposited with a currentless coppering bath.

9 Claims, No Drawings

PROCESS FOR PREPARATION OF METAL PATTERNS ON INSULATING CARRIER MATERIALS

The invention concerns a process for the preparation of metal patterns or designs on insulating carrier materials, in particular for the preparation of printed circuits.

Processes for the preparation of metal patterns on suitable supports by means of radiation treatments are already known. (DE-PS 17 97 223, DE-PS 22 30 980, DE-AS 22 38 002). These processes have as a rule the disadvantage, that the metal is also deposited more or less heavily on the non-illuminated places, which makes the conductor plates prepared in this manner practically worthless.

There is also known a process in which the nonselective metal deposition is suppressed through the use of certain additives; nonetheless, this process is also unsatisfactory, in particular with the use of copper seeds. (DE-AS 22 24 471)

It is therefore an object of the invention to provide a process for preparation of metal patterns by a photochemical route with complete elimination of undesired metal deposition.

This object is achieved through a process of the type described above, which is characterized by the following: the carrier is treated after suitable preparation with a photo-sensitizer which is free of wetting agents; the thus-treated carrier is subjected to treatment, with a radiation source, corresponding to the desired pattern; after rinsing of the carrier surface, the metal seeds which have been formed are augmented through the use of a palladium-salt solution; the metal seeds are treated in a currentless, metal-depositing nickel or nickel-cobalt bath and thereby thickened to form a layer; the metal layer which is formed is finally treated with an aqueous solution, which solution contains a complex forming agent for copper-(I) ions, whereupon a copper layer of the desired thickness is deposited by means of a currentless coppering bath, preferably stabilized with an inorganic cyanide and a selenium compound.

Particular embodiments of the invention include the following: 2,6-anthraquinone-disulfonic acid alkali salt may be used as photo-sensitizer; the photosensitizer is used in a mixture with a copper salt and sorbitol; as radiation source, a mercury vapor lamp with beamed light is used; as palladium salt solution a sulfuric acid palladium sulfate solution is used; the currentless metal-depositing nickel bath contains a nickel salt, a citrate and an alkali hypophosphite; the currentless metal-depositing nickel-cobalt bath contains a nickel salt, a cobalt salt, a citrate and an alkalihypophosphite; an aqueous solution containing an alkali cyanide as complex-forming agent for copper-(I) ions is used; and the currentless coppering bath contains an alkali cyanide and an alkali selenocyanate as stabilizers.

The inventive process is particularly suitable for the preparation of metal patterns on insulating carrier materials without any undesired metal deposition. This process also has the exceptional technical advantage, that the deposition of very fine conductor bands for printed circuits of a breadth of about 50 μm is made possible, while with conventional processes the width was generally on the order of 200 μm.

The inventive process also permits the deposition of this type of band of only one width through its length, which opens up previously unavailable technical possibilities.

As suitable insulating carriers for use in the inventive process may be mentioned epoxide resins thickened with glass fibers and phenol resin hard papers, in any case coated with a suitable adhesion-promoting agent.

The pretreatment of this carrier material can be carried out in conventional manner, for example through treatment with suitable organic solvents and fixing with chromosulfuric acid, with intermediate and subsequent rinsing operations.

For the effective action of the photo-sensitizer, it is of importance, as has been found, that it is used in the absence of surface-active agents, in particular wetting agents. This is particularly surprising, as these types of photo-sensitizers are customarily used in combination with wetting agent additives.

As photosensitizers, ferric salts such as ferric citrate and dichromates such as potassium dichromate, as well as anthraquinone derivatives, in particular 2,6-anthraquinone disulfonic acid alkali salts, may be employed, among others.

It should be understood, that the desired sensitizer is used with a reducible metal salt, such as a copper, nickel, cobalt or iron salt, or mixtures thereof, and in the presence of a reduction agent for this metal salt, preferably an alcohol or polyol, in particular sorbite.

For the after-treatment of the illuminated sensitizer, an aqueous solution of palladium salt in a concentration of about 50 mg palladium/liter is used, and preferably a sulfuric acid palladium sulfate solution.

This treatment causes an increase in the metal seeds formed by the irradiation, which are finally thickened with a chemical nickel or nickel-cobalt bath, for which purpose preferably baths based on nickel and/or cobalt salts and citrates, such as alkali citrates, as well as alkali hypophosphites, such as sodium hypophosphite, as reducing agent, are suitable.

As complex-forming agent for the marginally-soluble copper-(I) salts formed in the preceding process steps, mostly copper-(I)-bromide, any of the customary complex-forming agents suitable for this purpose may be used, but in particular alkali cyanides, such as sodium cyanide, can be used in concentrations of about 1 g/liter in alkali solutions.

The thickening of the metal patterns then follows by means of a currentless coppering bath based on copper salts, reducing agents, bases and complex-forming agents, containing an inorganic cyanide and a selenium compound as stabilizers.

As cyanide, alkali cyanides such as sodium cyanide in concentrations of from 15 to 30 mg/liter are suitable.

Suitable selenium compounds are organic, inorganic and organic-inorganic mono- and diselenides, and of these in particular the alkali selenocyanates, such as sodium selenocyanate, in minimal concentrations of about 0.1–0.2 mg/liter.

For the carrying out of the process it has been found to be particularly advantageous, when between the individual treatments there is a rinsing process with water and with air blowing.

As radiation source, it is advantageous to use a mercury vapor lamp, the beam from which illuminates an undefined surface in a stationary and uniform manner. It is advantageous to interpose a cobalt-glass sheet between the object and the radiation source, to avoid the overheating of the image negative used.

The following example serves to illustrate the inventive process.

EXAMPLE

With an adhesion-promoting surface based on nitrile gum elastic epoxide varnish, a coated printed circuit board of epoxide resins thickened with glass fiber is freed of boring dust by known chemical and/or mechanical means and then immersed for 1 minute in a solvent mixture of dimethylformamide-isopropanol (1:1). Thereafter, it is rinsed for 15 seconds with water under air blowing. Then follows the fixing in a fixing bath consisting of chromosulfuric acid containing 300 ml concentrated $H_2SO_4$ and 100 g $CrO_3$ per liter at 50° C. The fixing is discontinued after 6 minutes.

The board is rinsed for 15 seconds with water and then treated with a sulfuric acid iron-(II) sulfate solution for 5 minutes at room temperature. Then the conductor plate is rinsed for five minutes with water, 2 minutes with diluted sulfuric acid and then again for five minutes with water. There follows a neutralization with 5% sodium hydroxide at 50° C. and a subsequent water rinsing.

For a sensitizing pretreatment the conductor plate is then immersed for 5 minutes at 20° to 25° C. in a photo-sensitizer, with the following composition per liter water:

120 g sorbitol
16 g 2,6-anthraquinone disulfonic acid sodium salt
8 g copper acetate
0.5 g copper bromide
5 ml 50% fluoroboric acid
0.4 g polymethoxycellulose.

On a suitable roller coating apparatus the plate is then optimally coated with this photo-sensitizer, whereby at the same time the bore holes are freed of excess photo-sensitizer. Finally, the plate is dried at 100° C. for 20 minutes.

The bored plate is covered with a negative mask of the desired circuit pattern. The mask is fixed by pressure closely to the bored circuit plate. There follows a 2 minute irradiation with UV-light. The intimate joining of the mask with the conductor plate makes it possible to form an already clearly visible pattern of the circuit pattern only along the irradiated path and without stray light effects.

The bore hole walls are uniformly activated. The visible conductor paths, as also the deposits on the bore hole inner walls, consist of fine highly divided copper. These seeds are exchanged with palladium through the effects of an aqueous solution of 50 mg Pd/liter (as $PdSO_4$) and 25 ml. concentrated $H_2SO_4$/liter at room temperature. The subsequent rinsings with water and dilute sulfuric acid are followed by a 2 minute treatment with aqueous chemical nickel bath of the following composition:

25 g/liter $NiSO_4 \cdot 7H_2O$
26 g/liter $NaH_2PO_2 \cdot H_2O$
70 g/liter trisodium citrate
38 g/liter $Na_2B_4O_7 \cdot 10H_2O$, at a pH value between about 8.5–9.0 and a temperature of 50° C.

The nickel layer is then activated through treatment with an aqueous solution of 1 g/liter NaCN and 1 g/liter NaOH, and after rinsing with water the plate is treated for 20 hours with an aqueous chemical copper bath (average deposition speed 1.5 μm/hour) of the following composition:

10 g $CuSO_4 \cdot 5H_2O$/liter
36 ethylendiamine tetraacetic acid/liter
20 g NaOH/liter
4 ml formaldehyd (37%)/liter
25 mg NaCN/liter
0.1 mg KSeCN/liter.

There is obtained a conductor path up to 50 μm wide of high definition and a layer thickness of about 30 μm. The copper is characterized by its fine crystallinity, ductility and adhesive strength of at least 40 newtons/inch.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A process for the preparation of metal patterns on insulating carriers by photochemical means, in particular for the preparation of printed circuits, comprising treating the carrier after customary pretreatment with a photo-sensitizer free of wetting agents; irradiating the thus-treated carrier with a radiation source corresponding to the desired pattern; augmenting metal seeds formed on the carrier surface with an aqueous palladium-salt solution; forming a layer corresponding to the metal seeds with a currentless metal-depositing nickel or nickel-cobalt bath; treating the metal layer formed with an aqueous solution containing a complex forming agent for copper-(I) ions; and depositing a copper layer of the desired thickness with a currentless coppering bath, preferably stabilized with an inorganic cyanide and a selenium compound.

2. A process as defined in claim 1, wherein 2,6-anthraquinone disulfonic acid alkali salts are used as photo-sensitizer.

3. A process as defined in claim 1, wherein the photo-sensitizer is used in combination with a copper salt and sorbitol.

4. A process as defined in claim 1, wherein a mercury vapor lamp with beamed light is used as radiation source.

5. A process as defined in claim 1, wherein a sulfuric acid palladium sulfate solution is used as palladium salt solution.

6. A process as defined in claim 1, wherein a currentless, metal-depositing nickel bath containing a nickel salt, a citrate and an alkali hypophosphite is used.

7. A process as defined in claim 1, wherein a currentless, metal-depositing nickel-cobalt bath, containing a nickel salt, a cobalt salt, a citrate and an alkali hypophosphite is used.

8. A process as defined in claim 1, wherein an aqueous solution containing an alkali cyanide as complex-forming agent for copper-(I) ions is used.

9. A process as defined in claim 1, wherein a currentless coppering bath containing an alkali cyanide and an alkali selenocyanate as stabilizers is used.

* * * * *